(12) United States Patent
Yang et al.

(10) Patent No.: US 6,205,171 B1
(45) Date of Patent: Mar. 20, 2001

(54) ANTENNA SELECTOR SWITCH

(75) Inventors: Wen-Wei Yang, Hsin-Chu; Min Hung Shen, Hsinchu; Chen-Chung Kuo, Tainan; Shuw Guann Lin, Kausbong; Ssu-Pin Ma, Taipei, all of (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 09/075,076

(22) Filed: May 8, 1998

(51) Int. Cl.[7] ................................................. H04B 1/38
(52) U.S. Cl. ............................................ 375/219; 375/297
(58) Field of Search ..................... 375/219, 222, 375/297; 327/434, 435, 431, 376, 377

(56) References Cited

U.S. PATENT DOCUMENTS

| | | | |
|---|---|---|---|
| 5,764,098 | * 6/1998 | Taga et al. ............................. | 327/541 |
| 5,771,470 | * 6/1998 | Nimmo et al. ......................... | 455/572 |
| 5,812,951 | * 9/1998 | Ganesan et al. ....................... | 455/445 |
| 5,832,031 | * 11/1998 | Hammons, Jr. ........................ | 375/262 |
| 5,982,807 | * 11/1999 | Snell ...................................... | 375/200 |
| 6,018,644 | * 1/2000 | Minarik .................................. | 455/82 |
| 6,049,702 | * 4/2000 | Tham et al. ............................ | 455/78 |

* cited by examiner

*Primary Examiner*—Stephen Chin
*Assistant Examiner*—Mohammad Ghayour
(74) *Attorney, Agent, or Firm*—Proskauer Rose LLP

(57) ABSTRACT

A wireless LAN RF module uses a low power transistor switchable voltage divider circuit to control the bias input of a GaAs MESFET output power amplifier. This bias control circuit provides stable, high speed on-off switching of the power amplifier stage by applying low power bias voltages to the MESFET gate input, rather than by interrupting the high power MESFET drain to Vdd circuit.

3 Claims, 16 Drawing Sheets

3 STAGE GaAs MESFET RF PA

DIODE MODEL

DIODE OFF

DIODE ON

212

ANTENNA SELECTOR SWITCH

FIELD OF THE INVENTION

The present invention relates to a PCMCIA RF module. More specifically, the present invention relates to a wireless LAN transmitter/receiver utilizing direct sequence spread spectrum (DSSS) technology.

BACKGROUND OF THE INVENTION

The wireless local area network (LAN) represents a major trend in digital communications technology. IEEE specification 802.11 defines a direct sequence spread spectrum (DSSS) standard for wireless digital communication systems. A type of PCMCIA module which conforms to this standard includes an RF module, which provides the transmit/receive function. The focus of the present invention is the design of such an RF module.

A known configuration for a wireless LAN transmit/receive RF module, utilizing quadrature phase shift keyed (QPSK) modulation, is shown in block diagram form in FIG. 1.

In the receive mode, as selected by the ANT SW command, transmit/receive antenna 100,102 routes a received signal through a DR image filter FL1 to a transmit/receive (TX/RX) switch 1040, within the RF power amplifier and TX/RX switch block 104. The received signal (a QPSK modulated carrier at 2.4 GHz) is then amplified by low noise amplifiers (LNA) 106 and 1080, and filtered again by DR image filter FL2. In the RF/IF converter block 108, the carrier signal is down converted by mixer 1081 and a first local oscillator signal (2.1 GHz) from VCO 118. The down converted output is a 280 MHz IF QPSK signal, which is selectively filtered by channel filter FL3. The IF QPSK signal is then amplified to a constant power level by limiting amplifiers 1101 and 1102, within the Quadrature demodulator/modulator block 110.

A second local oscillator signal (560 MHz) is supplied from VCO 116 to the I/Q LO 1107, where it is digitally divided into an in-phase (I) 280 MHz signal and a 90-degree phase-shifted (Q) 280 MHz signal. The in-phase signal is fed to "I" mixer 1103, and the phase-shifted signal is fed to "Q" mixer 1105. The demodulated I and Q outputs (RXI and RXQ) represent the received baseband signals, and are filtered through low pass filters 1104 and 1106.

In the transmit mode, the process is essentially reversed. Baseband signals TXI and TXQ are filtered through low pass filters 1108 and 1109, and are then quadrature modulated by mixers 1110 and 1111, utilizing in-phase and phase-shifted 280 MHz signals from I/Q LO 1107. The 280 MHz IF QPSK output signal is amplified by amplifier 1112, filtered by channel filter FL5, and up converted by mixer 1083 to 2.4 GHz, in conjunction with the first LO signal (2.1 GHz) from VCO 118 and amplifier 1082. The up converted signal is filtered by DR image filter FL6, amplified by driver amplifier 1084, and filtered again by filter FL7. Finally, it is amplified by Power Amplifier 1041 and routed via switch 1040 and filter FL1 to transmit/receive antenna 100, 102.

There are numerous areas of design considerations for the performance improvement of the above described circuit. Those design areas relevant to the inventive wireless LAN transmitter/receiver disclosed herein are discussed below.

(1) Power Amplifier Linearity and Stability

An important parameter in the design of a QPSK modulation system is the linearity of the system. A potential source of nonlinearity is the power amplifier (PA) stage, so it is important that the drive level of this stage be maintained within a linear region (typically at least 3 dB below the compression point of the PA).

Another important design consideration for the PA stage is the speed and stability of its on-off switching, since this can be a limiting factor in QPSK performance. Therefore, it is very desirable to provide the PA with a stable, high speed on-off switching control circuit.

A typical prior art Power Amplifier circuit is shown in FIG. 2. GaAs MESFET's are widely used as power amplifiers in modern communication systems, due to their high efficiency and low distortion characteristics at high power levels. In most applications, two or more stages of power amplifier devices are cascaded to provide high power gain with low driving power. In the prior art circuit of FIG. 2, a 3-stage MESFET amplifier (D1, D2, D3) is shown, with three corresponding gate inputs connected to a resistor network (Rg11, Rg12, Rg21, Rg22, Rg31, Rg32, and variable resistor R_adj). This resistor network provides an appropriate bias voltage to each of the gate inputs (Vg1, Vg2, Vg3, respectively) from a negative voltage supply, such as −5 volts. The variable resistor R_adj is used to trim the bias drain current.

In most modern wireless communication systems, the RF output signal is transmitted in bursts. Therefore, the PA stage is turned on only when transmitting, and must be off when receiving. In order to achieve a high transmission rate, the PA stage must be capable of a very high on-off rate. In the circuit of FIG. 2, a P-channel MOSFET Q1 is used as the on-off switching device for PA D1, D2, D3. When Vctrl activates Q1 through resistor R1, Vdd is connected to the drains of PA D1, D2, D3, and the PA stage is turned on. Conversely, when Vctrl turns Q1 off, the PA stage is disconnected from Vdd, and is thus turned off.

A significant disadvantage of this prior art circuit approach is that the on-off switching takes place in the high current side of the PA stage, that is, between the drains and Vdd. For high power, high speed applications, the MOSFET switching device (Q1) must accommodate high current switching and discharging. Such MOSFET devices can be very expensive. Therefore, the circuit architecture of FIG. 2 is not optimal for high power, high speed switching applications.

(2) Antenna Select Switch Circuit

Another important design consideration relates to the port isolation of the antenna select switch circuit. In a typical prior art single pole, double throw RF switching arrangement, as shown in FIG. 3, a common RF in/out port at node C can be switched to either Antenna 1 or Antenna 2, depending on the bias condition of diodes D1 and D2. A switching control voltage (Ant Sel) provides a bias current through the Bias Circuit, which is in series with diode D1, quarter wavelength transmission line MLIN, and diode D2, to ground. When Ant Sel is high, diodes D1 and D2 are forward biased (turned on), so that they act as short circuits to the RF carrier frequency Fo. With diode D2 shorted to ground, quarter wavelength transmission line MLIN reflects an open (high impedance) at node C, thus preventing an RF signal from passing to Antenna 2. At the same time, shorted diode D1 provides a direct path for an RF signal to Antenna 1.

When Ant Sel is low, diodes D1 and D2 are reverse biased (turned off), so that they act as open circuits to the RF carrier frequency. In this case, open circuited diode D1 isolates node C from Antenna 1, while quarter wavelength transmission line MLIN provides a through path due to the open circuited diode D2. Thus, an RF signal at node C is connected to Antenna 2 through MLIN.

An important disadvantage of the prior art circuit of FIG. 3 is that this circuit is susceptible to diode parasitic effects, which can significantly degrade the port isolation of the off branch. This degradation can occur because diodes D1 and D2 are not perfect switches, due to their capacitive and inductive characteristics, as depicted in FIGS. 4A–4C. FIG. 4A shows the equivalent circuit of a diode model, FIG. 4B represents the diode in its off mode, and FIG. 4C represents the diode in the on mode. Referring to FIG. 4A, the inductor Ls represents the parasitic series inductance in both the on and off modes. The capacitor Cj represents the junction capacitance of the diode, and capacitor Ct represents the parasitic capacitance between cathode and anode terminals. The resistor Ron/Roff represents the diode resistance, depending on the diode mode (on or off).

In the off mode, as shown in FIG. 4B, resistor Ron/Roff is an open circuit, but parasitic capacitor Ct, and junction capacitor Cj in series with parasitic inductor Ls, form possible leakage paths between cathode and anode terminals at the RF carrier frequency Fo. As a result, the port isolation may be significantly degraded.

In the on mode, as shown in FIG. 4C, resistor Ron/Roff is a short circuit around junction capacitor Cj, but parasitic inductance Ls can decrease the short circuit effect of the diode at the RF frequency. Again, the port isolation may be significantly degraded.

Therefore, it is very desirable to provide an antenna select circuit that minimizes the parasitic effects described above.

(3) EMI Radiation and Susceptibility

Still another very important design consideration for improving receiver performance is the reduction of EMI radiation and susceptibility characteristics of the entire RF module. Considering the compact packaging requirements for this type of RF module (for example, in a mobile phone), it becomes especially important to control the EMI parameters.

One common method of EMI control uses physical shields between different types of circuits (e.g., low power and high power; low frequency and high frequency; etc.) and between the RF module and external noise sources. Recent examples of this type of physical shielding are described in the prior art patents noted below.

In U.S. Pat. No. 5,341,274, Nakatani et al. disclose an EMI suppression technique using an insulation layer and a conductive layer integrated into the printed circuit board design.

In U.S. Pat. No. 5,428,506, Brown et al. disclose an EMI suppression technique using a laminate of lossy material and dielectric material between the voltage supply plane and the ground plane.

In U.S. Pat. No. 5,466,893, Nakatani et al. disclose an EMI suppression technique using one or more insulation layers and conductive layers integrated into the printed circuit board design.

In U.S. Pat. No. 5,500,789, Miller et al. disclose an EMI shielding apparatus with various grounding configurations.

However, any such additions of physical shielding to a compact printed circuit board assembly may increase the size and/or weight of the unit, which is disadvantageous to both the user and the manufacturer.

Accordingly, it is an object of the present invention to overcome the various disadvantages of the prior art, as described above. Moreover, for purposes of disclosure clarification, the inventive features will be divided into two categories, as follows:

(1) Transmitter performance improvement
   Power Amplifier stage switching
(2) Receiver performance improvement
   Antenna port isolation
   EMI suppression

SUMMARY OF THE INVENTION

In accordance with an illustrative embodiment of the present invention, a wireless transmitter/receiver RF module is configured on a multi-layer printed circuit assembly. A transmit/receive switching control circuit routes a quadrature phase shift keyed (QPSK) digitally modulated carrier signal to be transmitted from the RF module to a transmit antenna, and, alternately, routes a QPSK modulated carrier signal to be received from a receive antenna to the RF module receive channel.

A received signal is first amplified by a two-stage low noise amplifier, and is then down converted from RF to IF in conjunction with a first local oscillator signal. The IF signal is then demodulated in conjunction with a second local oscillator signal, and the baseband I and Q signals are extracted.

A transmit signal begins with baseband I and Q signals being inputted to the transmit channel of the RF module. The I and Q signals are vector modulated onto an IF signal in conjunction with the second local oscillator. The modulated IF signal is then up converted to RF in conjunction with the first local oscillator signal. The modulated RF signal is then amplified in a power amplifier stage, and routed to the transmit antenna.

An inventive feature of the power amplifier stage relates to the bias control circuit of the power amplifier. A multi-stage GaAs MESFET is used for the power amplifier, due to its gate control characteristic, which achieves rapid turn off when a sufficient negative control voltage is applied to the gate circuit. A transistor controlled voltage divider network provides either on or off gate control voltages to the power amplifier gate circuit, resulting in high-speed, low power, highly stable switching control. Thus, transmitter performance is enhanced without the need for high cost switching devices.

A synthesizer circuit, locked to a reference oscillator, includes dual phase locked voltage controlled oscillators (VCO's), which provide the first and second local oscillator signals to the RF/IF converters and to the quadrature demodulator/modulator, respectively.

Parasitic suppression circuits are inserted into the antenna switching control circuit, and EMI suppression and isolation components are inserted into the quadrature demodulator/modulator circuit and the synthesizer circuit. These inventive circuit modifications improve antenna port isolation, attenuate power supply noise, and suppress spurious radiation. Thus, receiver performance is improved, and less physical shielding is required on the printed circuit board assembly.

An illustrative embodiment of the present invention is more fully described below in conjunction with the following drawings.

DETAILED DESCRIPTION OF THE INVENTION

Figure 1:
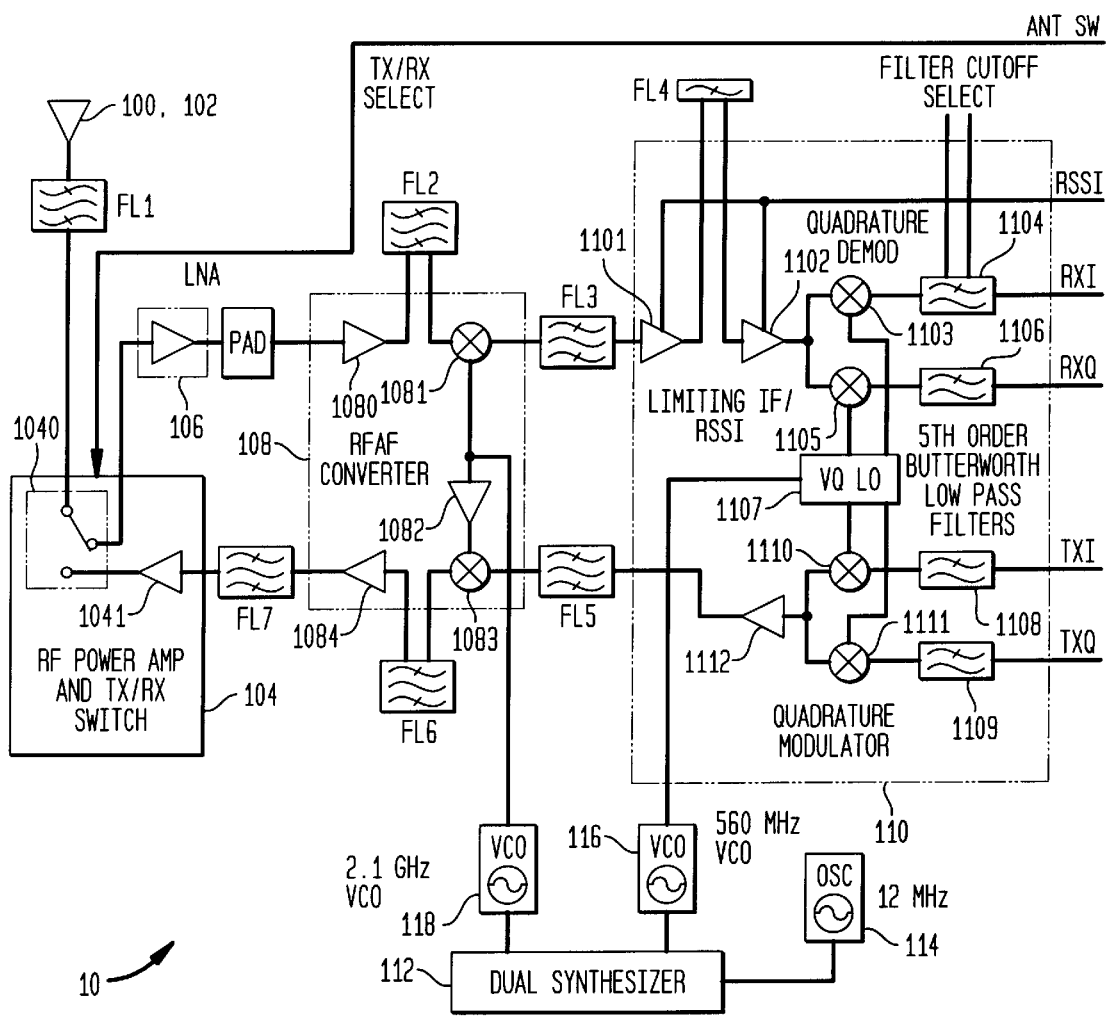
FIG. 1 is a simplified block diagram of a known RF module design.
Figure 2:
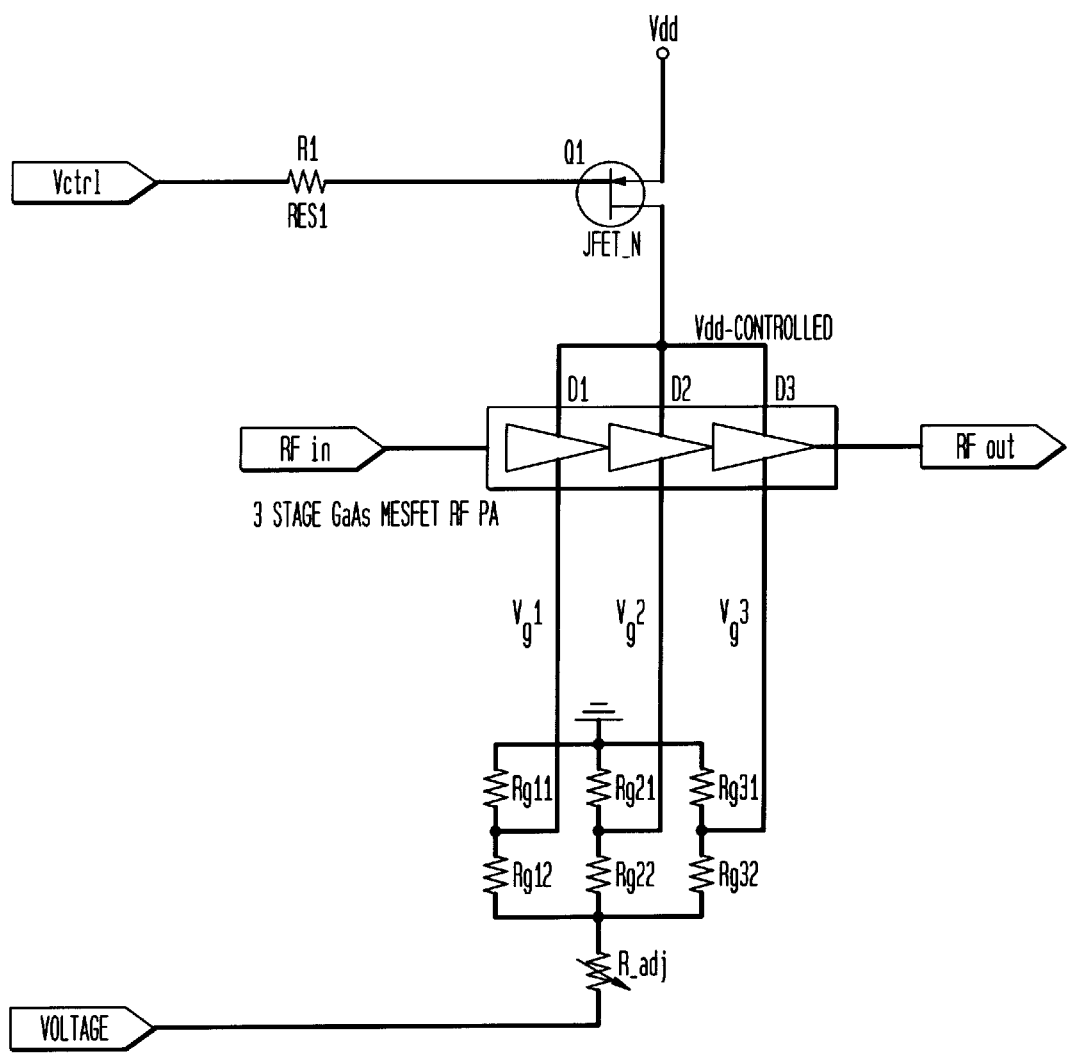
FIG. 2 is a schematic of a prior art Power Amplifier stage.
Figure 3:
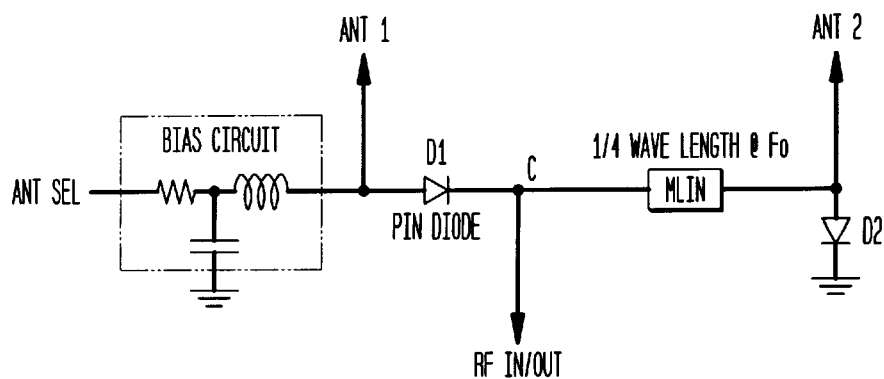
FIG. 3 is a schematic of a prior art Antenna Select circuit.
Figure 5A:
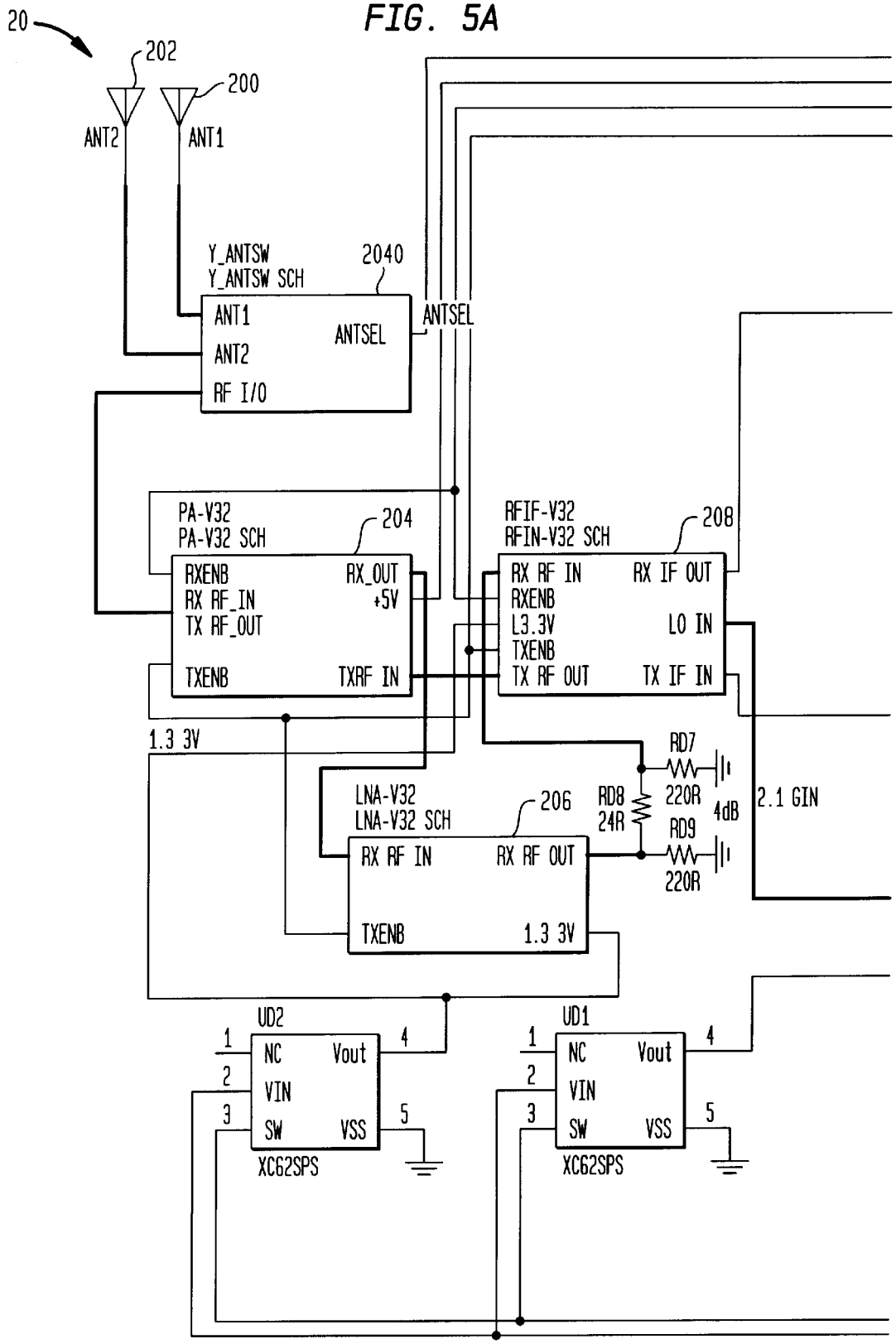
FIG. 5 is a schematic diagram of the inventive RF module.
Figure 5B:
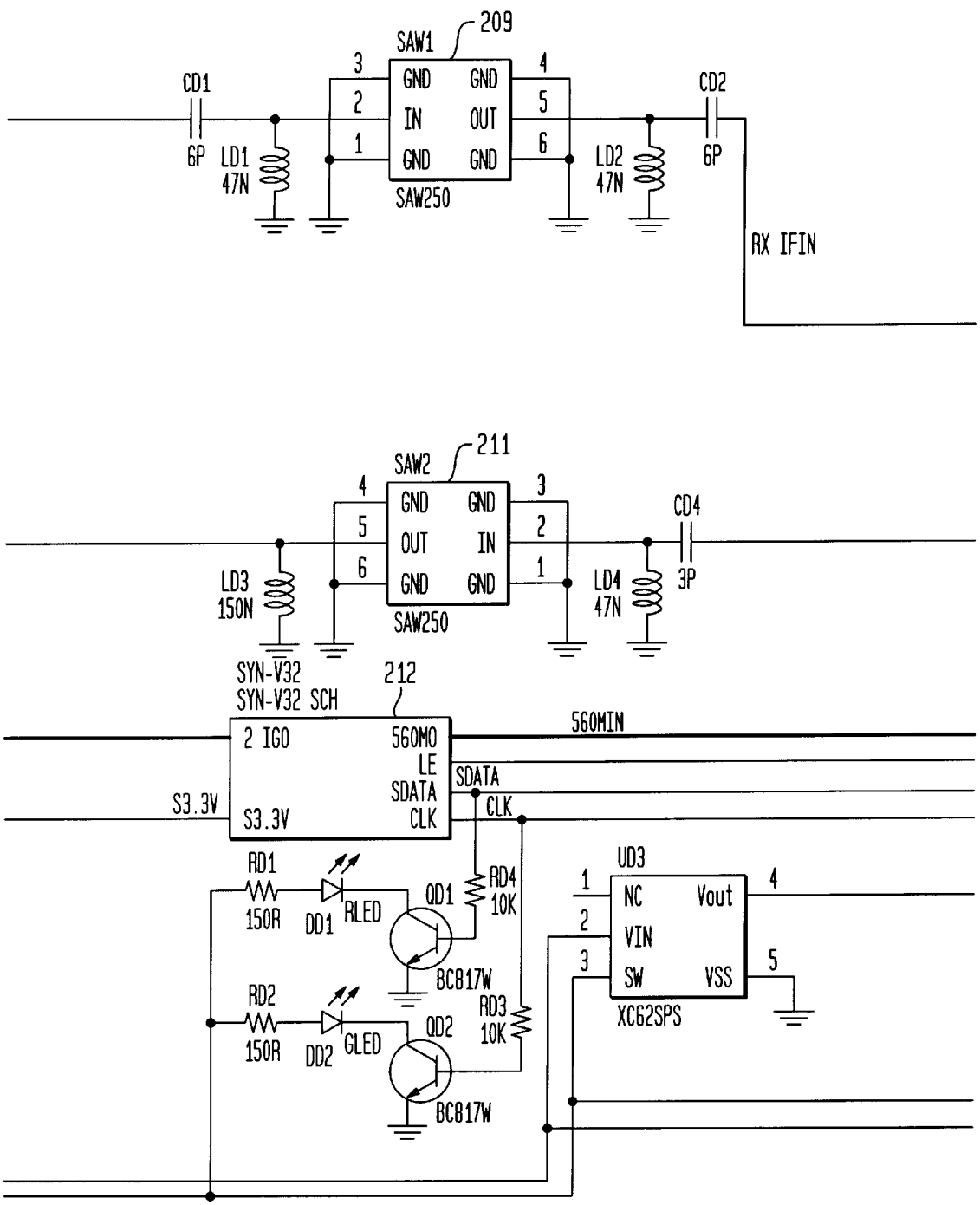
Figure 5C:
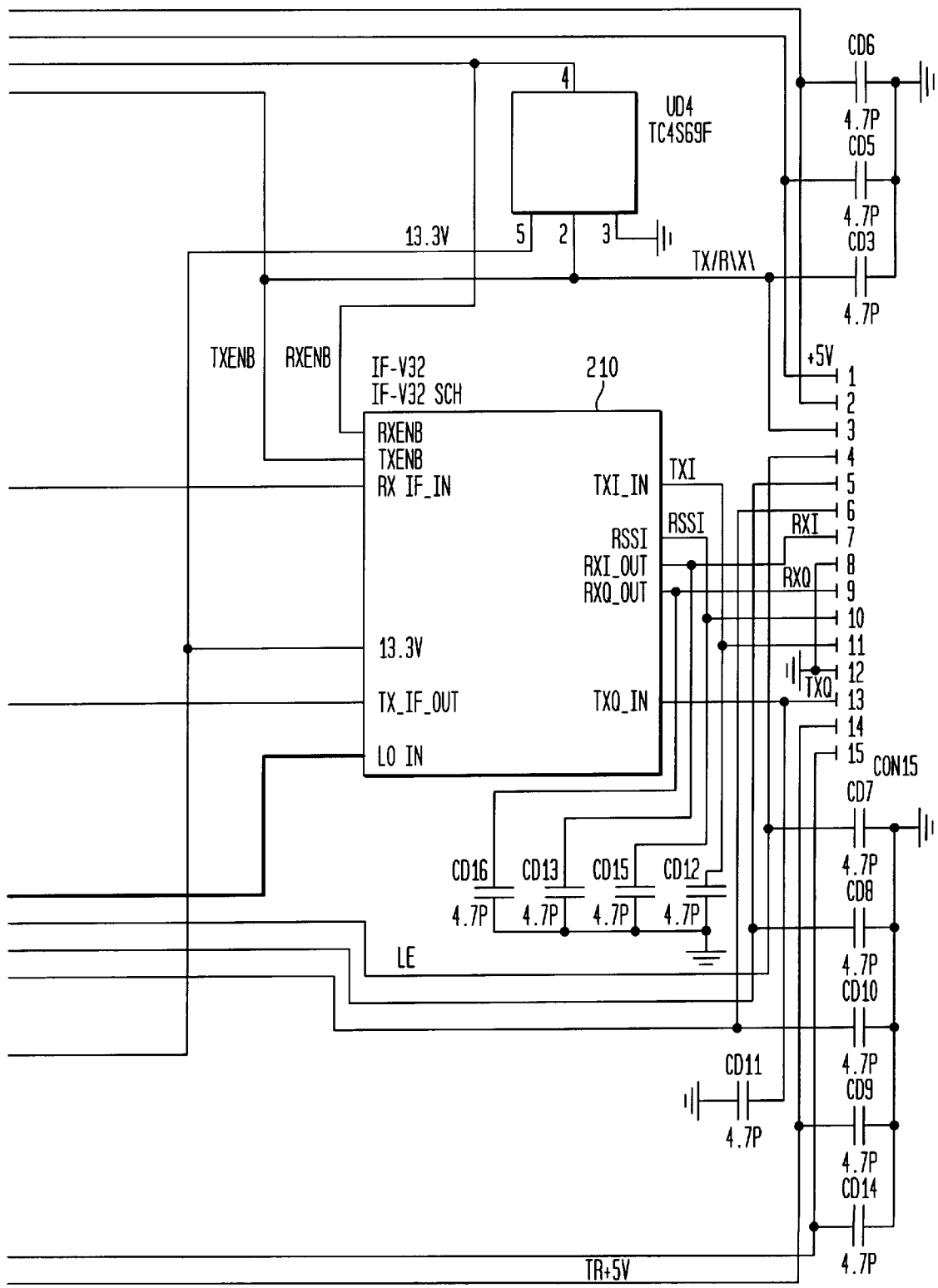

The inventive wireless LAN transmitter/receiver 20 is shown schematically in FIG. 5, and is functionally similar to the above described RF module 10 of FIG. 1. The antennas 200, 202 are selected by antenna select switch 2040, depending on whether transmit (TX) or receive (RX) has been enabled.

In receive enable (RXENB) mode, a receive signal (RXRFIN) is first routed by receive antenna 200 or antenna 202 and antenna select switch 2040, via power amplifier (PA) block 204, to low noise amplifier (LNA) 206. The amplified output (RXRFOUT) is then down converted in RF/IF converter 208 to an IF signal (RXIF). Channel filter 209 selectively filters the down converted receive signal (RXIFOUT) and inputs it (RXIFIN) to quadrature demodulator/modulator 210. The demodulator section of quad demod/mod 210 extracts the I, Q baseband signals from the RX IF signal and outputs them to the system as RXI and RXQ.

In transmit enable (TXENB) mode, the baseband I, Q signals (TXI, IXQ) are inputted from the system to quad demod/mod 210, where they are modulated and combined into a TXIF output signal. This TXIF signal is selectively filtered by channel filter 211 and then up converted in RF/IF converter 208 to TXRF. The outputted signal (TXRFOUT) is then amplified by PA 204 and routed to transmit antenna 200 or antenna 202 via antenna select switch 2040.

Two separate phase locked local oscillator (LO) signals are generated by synthesizer assembly 212. A first LO is used by RF/IF converter 208 and a second LO is used by quad demod/mod 210. Illustratively, the RF carrier frequency of the disclosed system is 2.4 GHz, the first LO is 2.1 GHz, and the second LO is 560 MHz. Also illustratively, the IF is 280 MHz.

As stated above, the inventive features of the present invention will be divided into two categories; (1) Transmitter performance improvement, and (2) Receiver performance improvement.

(1) Transmitter Performance Improvement

Figure 6A:
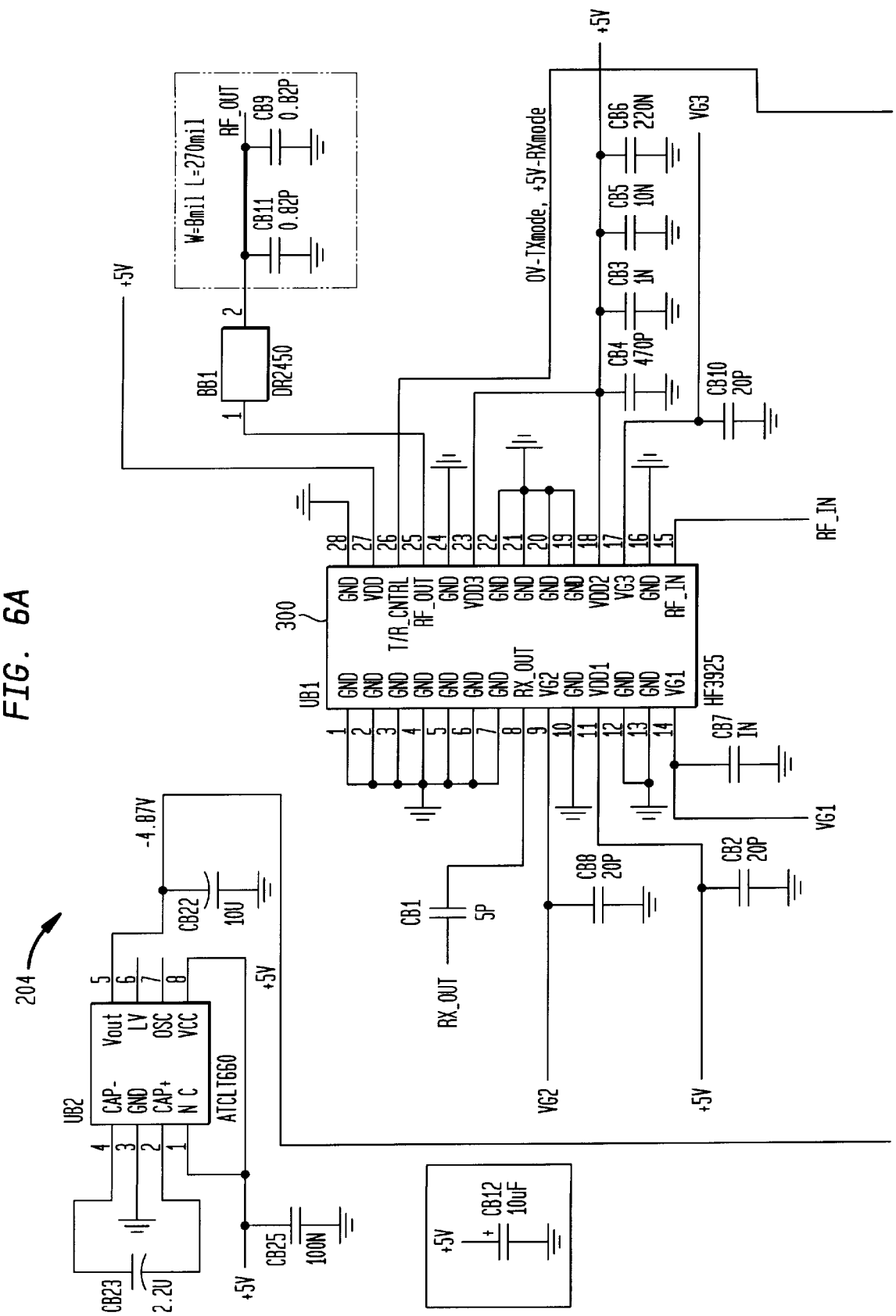
FIG. 6 is a schematic diagram of the inventive Power Amplifier stage.
Figure 6B:
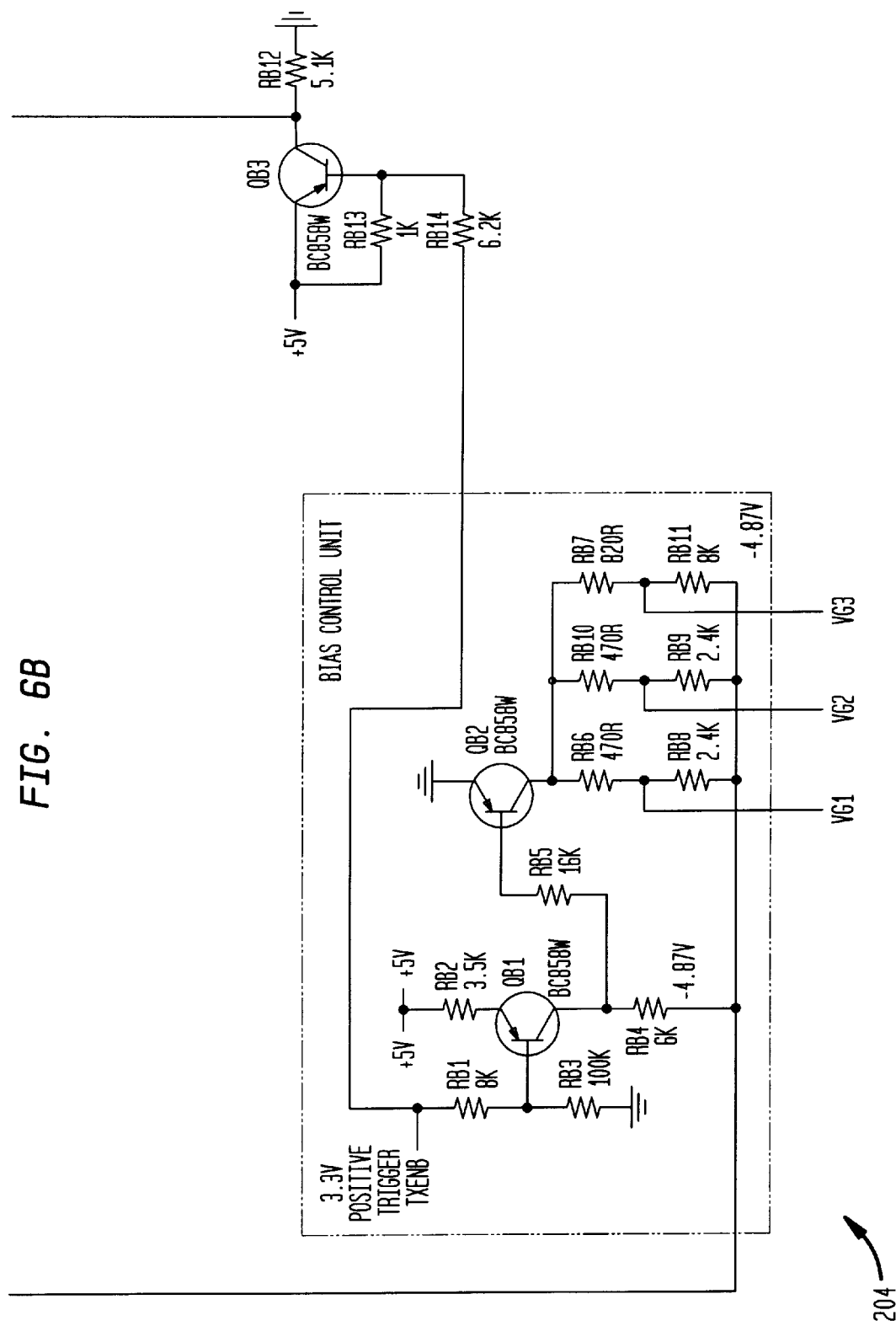

Improving the switching speed and stability of the power amplifier stage will have a direct benefit on Transmitter performance. The inventive Power Amplifier assembly 204 of FIG. 5 is shown in more detail in FIG. 6. In particular, the Power Amplifier bias control circuit is shown as transistors QB1, QB2, and associated resistors RB1–RB11. Illustratively, the power amplifier (PA) 300 is a three-stage GaAs MESFET, with three gate control voltage inputs (VG1, VG2, VG3). In order to turn off PA 300 very rapidly, it is necessary to either shut off the drains, as in the prior art, or else apply a sufficient negative voltage to the gates. In the case of a GaAs MESFET, as is used here, it is more efficient to apply a sufficient negative voltage to the low power gate circuits, rather than to the high power drain circuits, so that the switching transition can be made very rapidly, with a minimum of ringing, or bounce. This is precisely the function of the bias control transistors QB1 and QB2, which provide the rapid switching action of the voltage levels of VG1, VG2, and VG3, as described below.

In the transmit mode, TXENB turns QB1 off, which then turns on QB2, thus connecting resistive divider network RB6–RB11 between negative voltage (illustratively –4.87 v) and ground, through QB2. This sets the bias control voltages (VG1, VG2, VG3) to the normal operating levels of the gates of PA 300. In receive mode, QB1 is on, and QB2 is turned off, thereby connecting VG1, VG2, and VG3 to the negative supply voltage, i.e., –4.87 v. The three negative gate inputs (VG1, VG2, VG3) shut off PA 300 very rapidly, and with a high level of stability, due to the design simplicity and low power level of the bias control circuitry.

(2) Receiver Performance Improvement

Figure 4A:
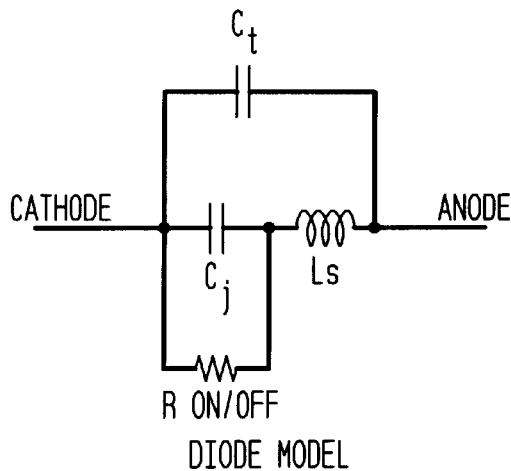
FIGS. 4a–4c depict diode model characteristics.
Figure 4B:
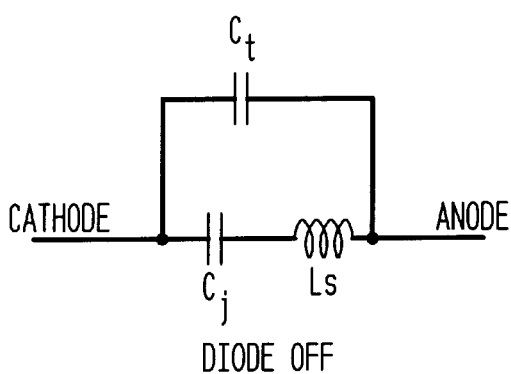
Figure 4C:
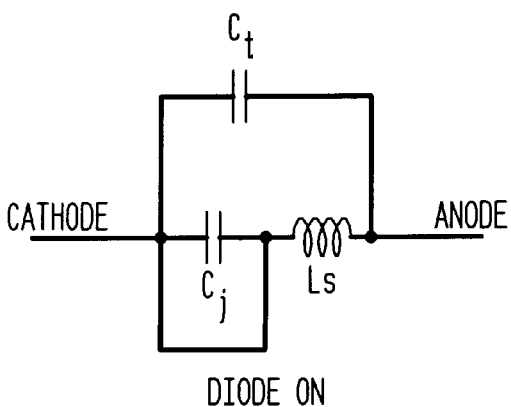
Figure 7:
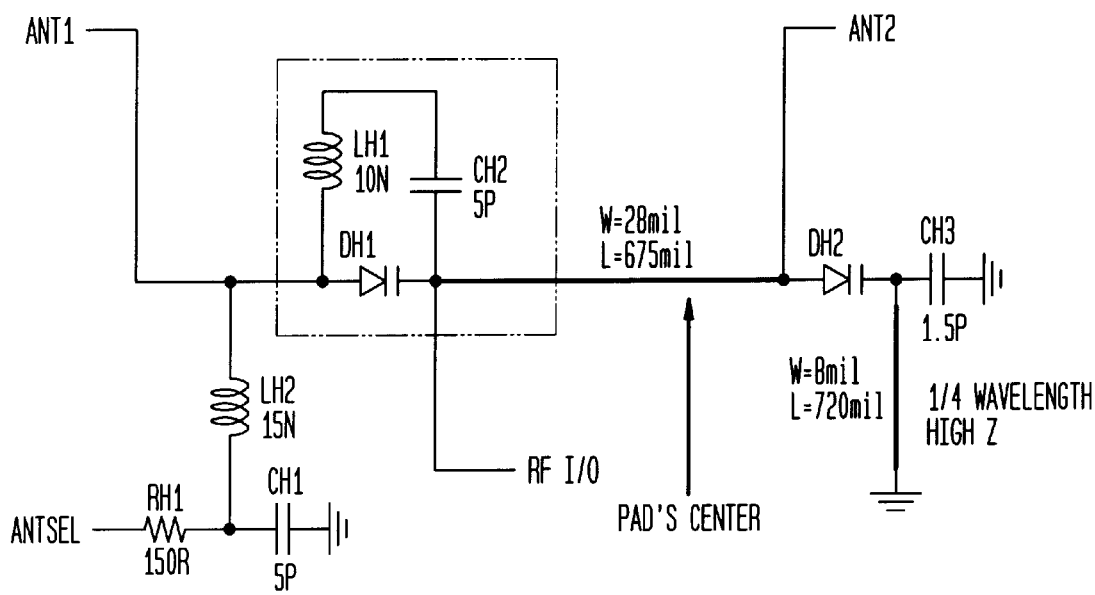
FIG. 7 represents the inventive Antenna Select circuit.

One aspect of enhancing Receiver performance in the present invention is to suppress the parasitic effects of the diodes in the Antenna Select circuit. As described above in regard to prior art FIGS. 3 and 4A–4C, the conventional Antenna Select circuit is susceptible to parasitic effects, which can significantly degrade the port isolation of the off branch. To minimize any degradation due to these parasitic elements, compensating elements have been introduced into the diode circuits in the inventive RF module, as indicated in FIG. 7. In this Antenna Select circuit, inductor LH1 and capacitor CH2 have been added to the diode DH1 circuit. CH2 simply provides DC blocking for the bias current, while LH1 is designed to resonate with the parasitic capacitance of DH1 (Ct in FIG. 4B) at the RF frequency when DH1 is in the off mode. In addition, capacitor CH3 has been added between diode DH2 and ground, while a 1/4 wavelength (high impedance) transmission line has also been added from DH2 to ground. CH3 is designed to resonate with the parasitic inductance of DH2 (Ls in FIG. 4C) at the RF frequency when DH2 is in the on mode, while the 1/4 wavelength transmission line provides a DC return path for the bias current. Thus, the two main sources of port isolation degradation (parasitics Ct and Ls) are effectively neutralized by the inventive compensating elements (LH1 and CH3) at the operating RF frequency.

Another aspect of enhancing Receiver performance in the present invention is to reduce EMI radiation and susceptibility of the more sensitive circuits in the RF module. This is achieved through a combination of circuit modifications and PCB layout configurations. More specifically, the inventive EMI reduction techniques have been implemented in the following areas:

(a) Quadrature Demodulator/Modulator
 (b) Synthesizer
 (c) Printed Circuit Board (PCB)

These techniques are described in detail below.

(a) Quadrature Demodulator/Modulator

Figure 8A:
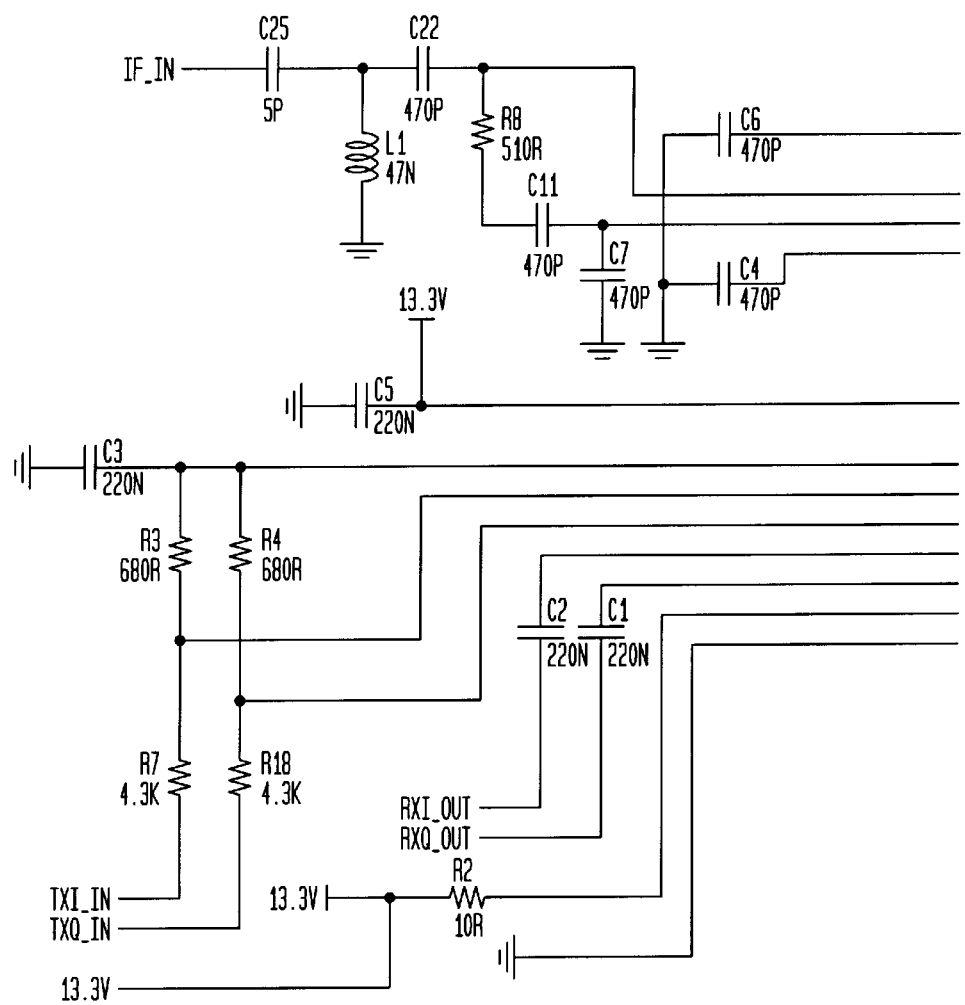
FIG. 8 is a schematic diagram of the inventive IF Quadrature Demodulator/Modulator circuit.
Figure 8B:
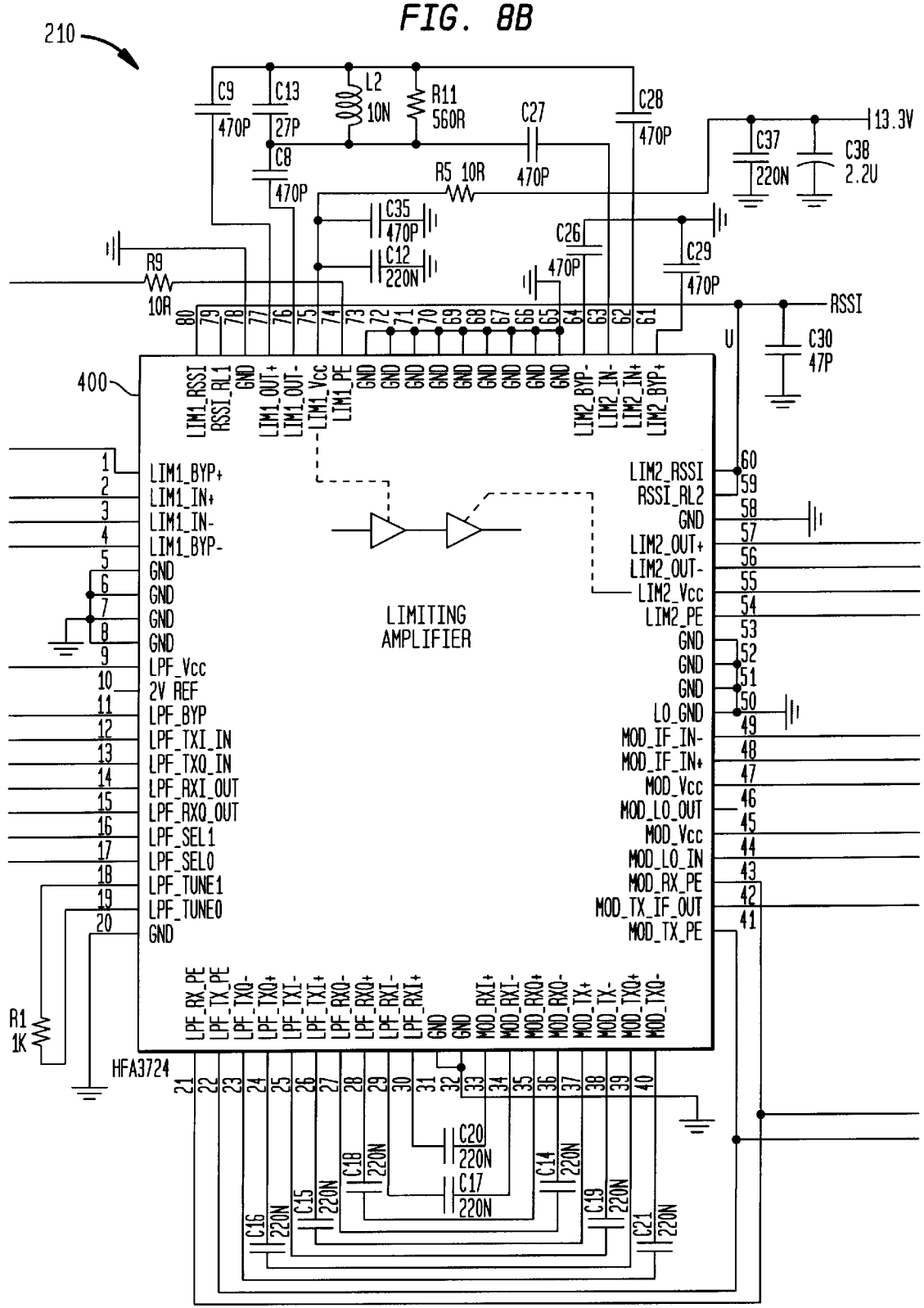
Figure 8C:
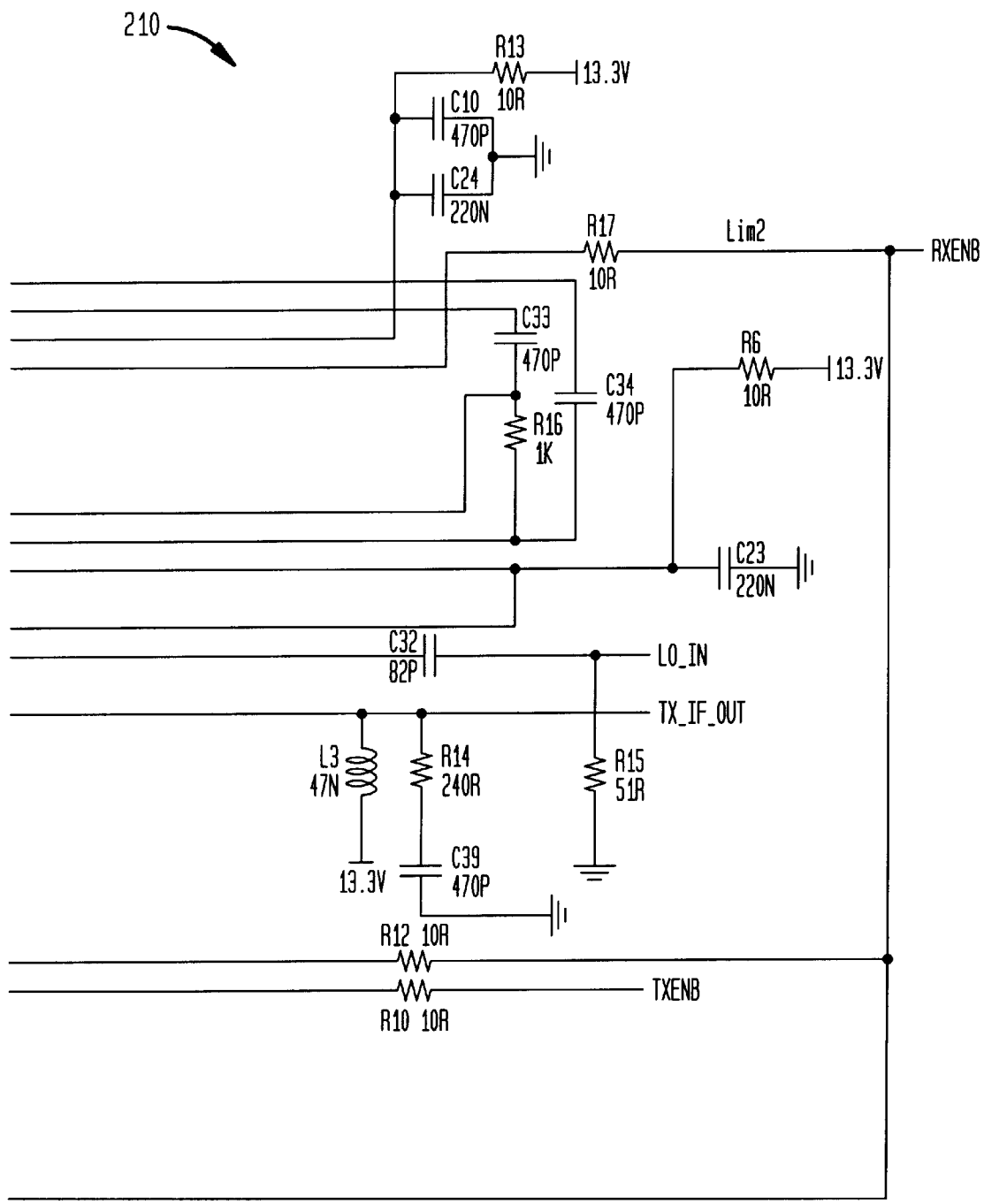

The Quad Demod/Mod 210 of FIG. 5 is shown in greater detail in FIG. 8, where the IF IC 400 includes the IF amplifiers, mixers, I/Q LO divider, and filters previously described. The inventive EMI reduction circuits are shown in FIG. 8 as a combination network of filtering and attenuating resistors and capacitors, which are designed to prevent any power supply (3.3 v) noise signals from interfering with the IF circuits, and to reduce spurious radiation, as well. This is particularly important for the two-stage, high gain limiting amplifiers (shown as 1101 and 1102 in FIG. 1), due to their sensitivity to noise. Specifically, capacitors C37, C38, and resistor R5, in conjunction with capacitors C35 and C12, provide high and low frequency bypass paths, in addition to noise signal attenuation, between the limiting amplifiers of Quad Demod/Mod 210 (FIG. 8) and the 3.3 v power supply.

Similarly, capacitors C24 and C10, in conjunction with resistor R13, provide the same type of filtering and attenuation, since they are also connected between the limiting amplifier circuit and the power supply line.

(b) Synthesizer

Figure 9A:
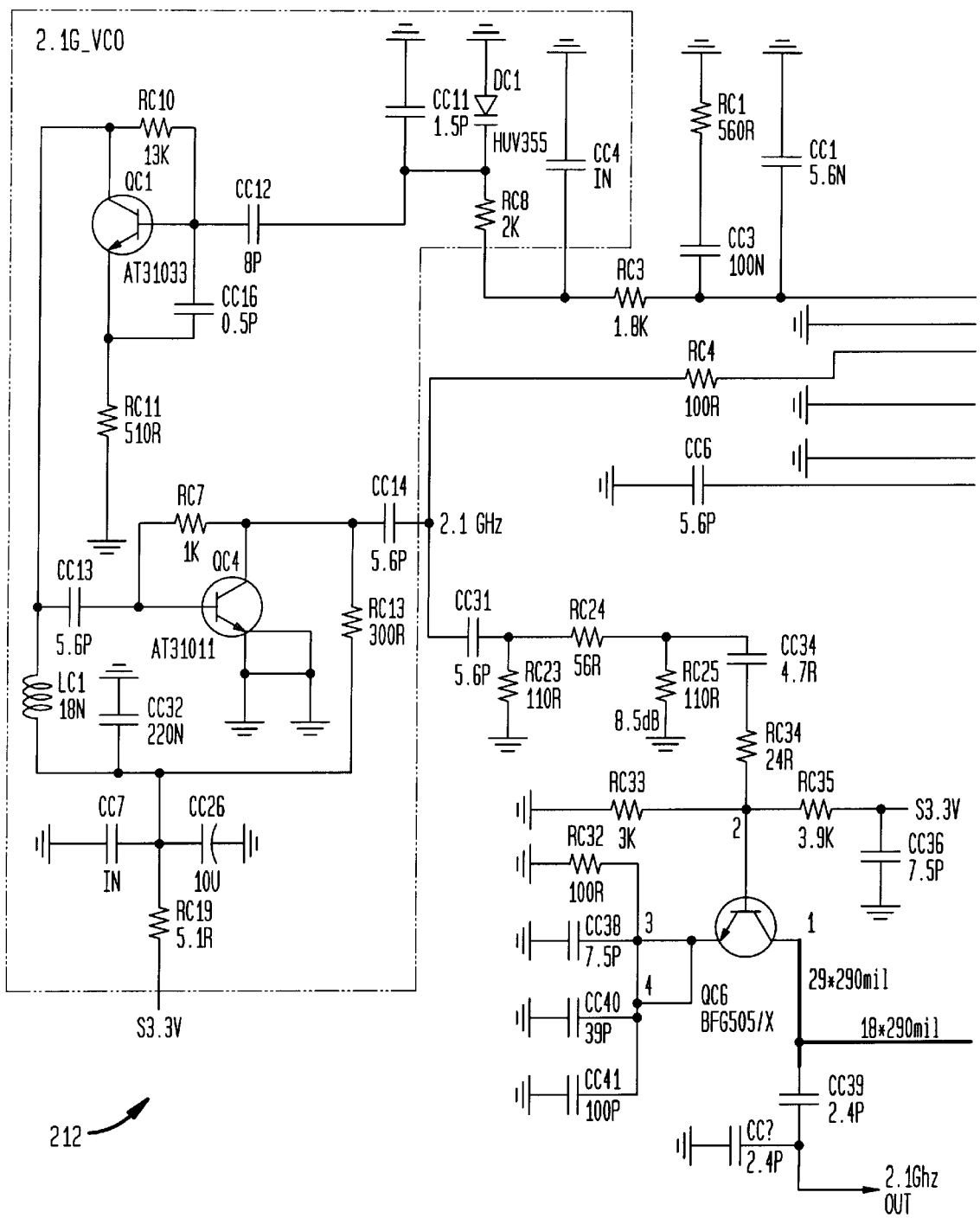
FIG. 9 is a schematic diagram of the inventive Synthesizer circuit.
Figure 9B:
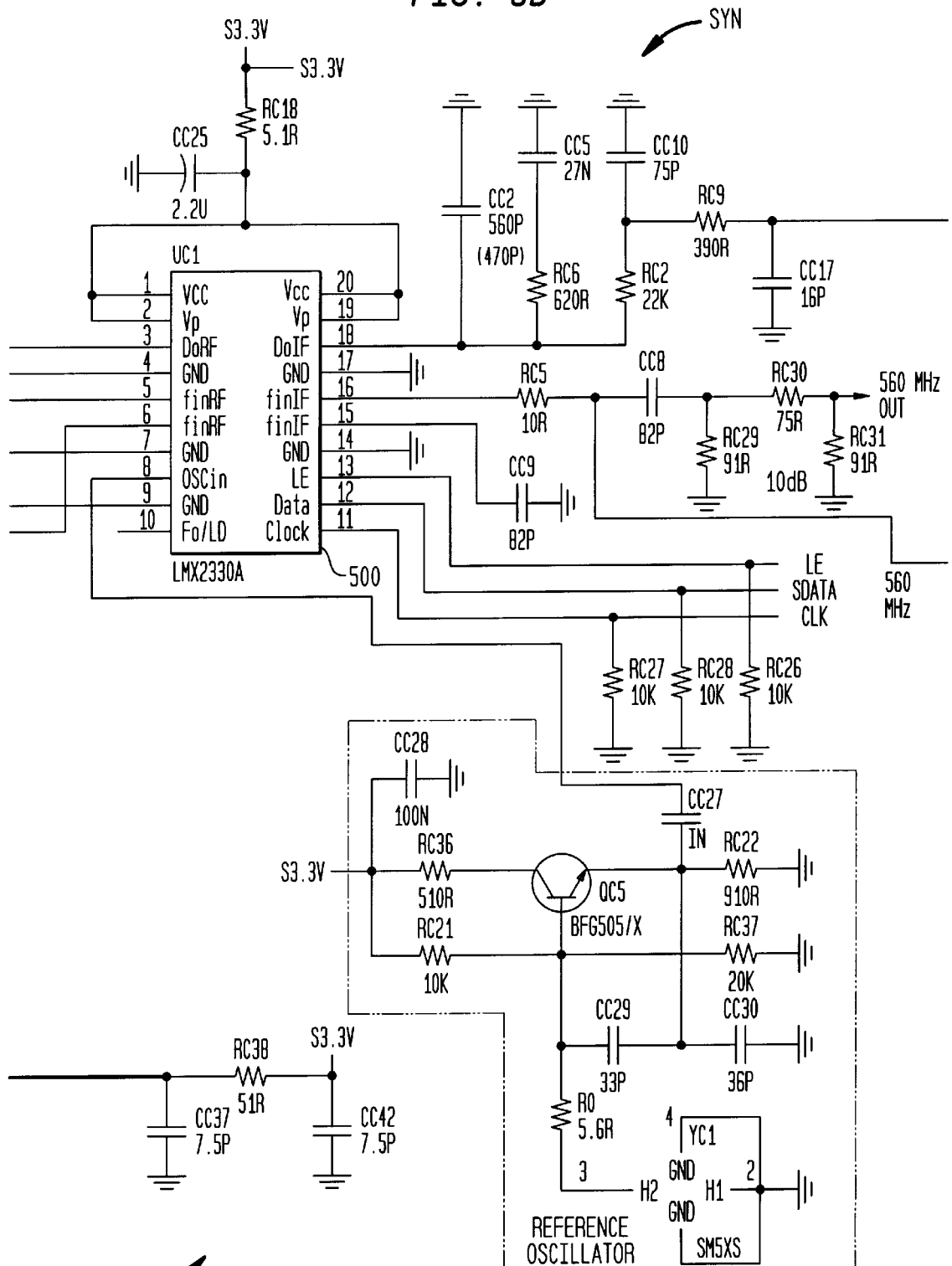
Figure 9C:
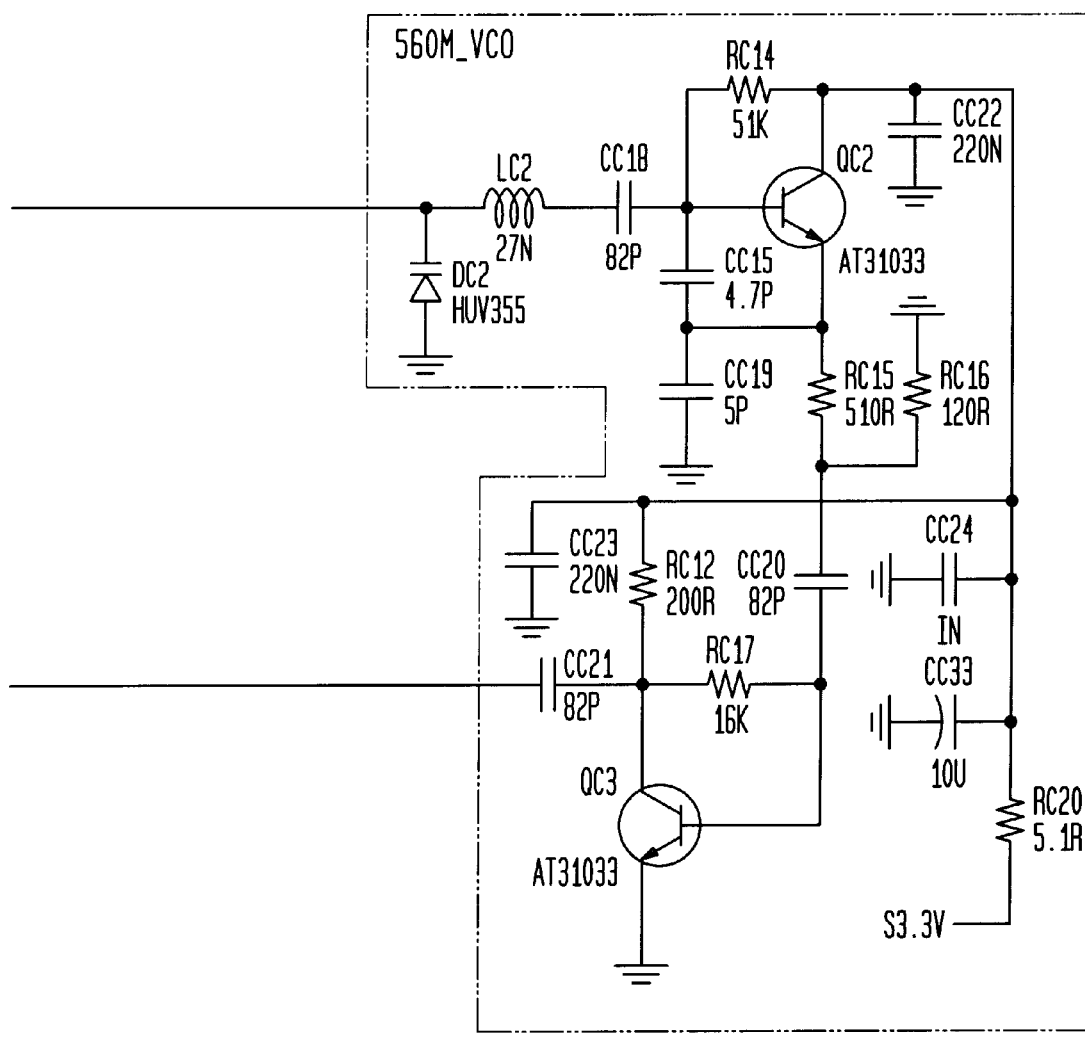
Figure 10:
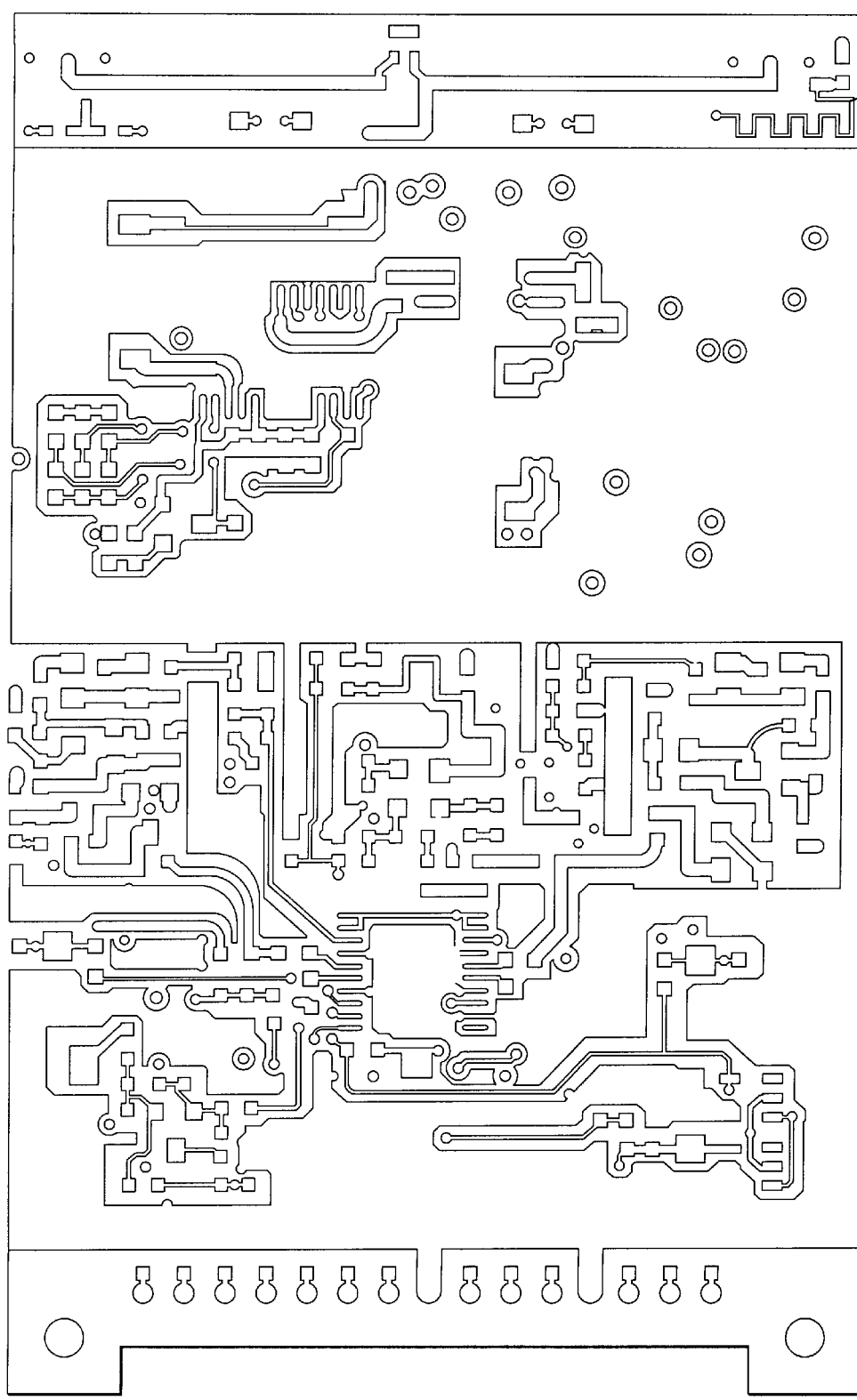
FIG. 10 is a layout of the bottom PCB layer.

The Synthesizer assembly 212 of FIG. 5 is shown in greater detail in FIG. 9, where IC 500 includes the synthesizer frequency divider and phase comparator circuitry. QC1 and QC4 are the 2.1 GHz voltage controlled oscillator (VCO) transistors, with DC1 as a tuning varactor. QC2 and QC3 are the 560 MHz VCO transistors, with DC2 as a tuning varactor. QC5 is the 12 MHz reference oscillator transistor, and QC6 is an output impedance matching amplifier transistor for the 2.1 GHz LO frequency.

The inventive EMI reduction circuits are shown in FIG. 9 as a combination of filtering capacitors and attenuating resistors, which are designed to prevent any power supply (3.3 v) noise signals from interfering with the VCO circuits, and to reduce spurious radiation, as well. Specifically, capacitors CC24, CC33 and resistor RC20 provide high and low frequency bypass paths, in addition to noise signal attenuation, between the 560 MHz VCO circuitry and the 3.3 v power supply. In addition, capacitors CC37 and CC42, in conjunction with resistor RC38, form a π filter, which provides a high degree of isolation between the 2.1 GHz VCO/LO circuitry and the 3.3 v power supply line.

Moreover, resistor RC4 is used as a resistive coupling element for the phase lock loop feedback line of the 2.1 GHz VCO, instead of the more conventional capacity coupling. In a capacitive coupled feedback circuit, impedance mismatches can cause the feedback line to act as an antenna, and to radiate the oscillator frequency signal as EMI. The use of resistive coupling, however, increases the feedback line's return loss, thus reducing the possibility of this type of EMI radiation. Similarly, resistor RC5 performs the radiation reducing function in the phase lock loop feedback line of the 560 MHz VCO.

(c) Printed Circuit Board (PCB)

Illustratively, the inventive PCB is configured as a 6-layer board assembly. This configuration allows for very good isolation between the high frequency circuits and the power supply components, and with less shielding than is required with the more conventional 4-layer board assemblies. The bottom board layer is shown in FIG. 9, to illustrate the inventive design of the additional 1/4 wavelength high Z transmission line element of the antenna select circuit (FIG. 7). This transmission line element is configured horizontally, in order to save space and to provide an easy positioning arrangement.

In short, an RF module for a wireless LAN transmitter/receiver is disclosed with two inventive categories:

(1) Transmitter performance improvement via a fast-switching, stable, bias control circuit for the Power Amplifier stage; and (2) Receiver performance improvement via:

a) parasitic compensation circuits in the Antenna Select circuit to improve port isolation, b) combinations of RC filters and spurious radiation attenuating resistors in the Quad Demod/Mod and Synthesizer assemblies, to reduce the need for extensive physical shielding on the PC board assembly.

Moreover, the disclosed RF module can be used not only in computer peripheral devices and high-speed data transmission networks, but also in a wide variety of digital communications applications, such as wireless industrial control, automatic form reading, warehouse management, and remote control.

The above described embodiments of the invention are intended to be illustrative only. Numerous alternative embodiments may be devised by those skilled in the art without departing from the spirit and scope of the following claims.

Finally, the above-discussion is intended to be merely illustrative of the invention. Numerous alternative embodiments may be devised by those having ordinary skill in the art without departing from the spirit and scope of the following claims.

What is claimed is:

1. A wireless transmitter/receiver circuit disposed on a PC board assembly, comprising:

a transmitting antenna and a receiving antenna, for transmitting and receiving, respectively, a digitally modulated carrier signal, a transmit/receive switching control circuit for selecting said transmitting and receiving antennas, a Power Amplifier assembly connected to said transmitting antenna via said transmit/receive switching control circuit, having a power amplifier circuit for amplifying said digitally modulated carrier signal prior to its being transmitted by said transmitting antenna, said power amplifier circuit comprising at least one gallium arsenide MESFET having a gate connected to a switchable voltage divider, said switchable voltage divider for rapidly switching said power amplifier MESFET on and off, by applying a first bias voltage to said gate for on, and by applying a second bias voltage to said gate for off, a Low Noise Amplifier circuit connected to said receiving antenna via said transmit/receive switching control circuit, for amplifying said digitally modulated carrier signal after being received by said receiving antenna, a down converter circuit connected to an output of said Low Noise Amplifier for converting said received digitally modulated carrier signal from RF to IF, a quadrature demodulator/modulator circuit connected to an output of said down converter circuit for demodulating said received digitally modulated IF carrier signal to a digitally encoded baseband receive signal, said quadrature demodulator/modulator circuit for modulating a transmit IF carrier frequency with a digitally encoded baseband transmit signal, an up converter circuit for receiving said modulated IF transmit signal from said quadrature demodulator/modulator circuit, and for converting said modulated IF transmit signal from IF to RF, wherein said up converter circuit outputs said modulated RF transmit signal to said power amplifier circuit in said Power Amplifier assembly, a synthesizer circuit comprising a first local oscillator circuit and a second local oscillator circuit, wherein said synthesizer circuit outputs a first local oscillator signal to an input of said up converter circuit and said down converter circuit, and wherein said synthesizer circuit outputs a second local oscillator signal to an input of said quadrature demodulator/modulator circuit.

2. The wireless transmitter/receiver circuit of claim 1 wherein said power amplifier comprises a three-stage gallium arsenide MESFET having a three-gate input circuit.

3. A Power Amplifier circuit comprising at least one gallium arsenide MESFET having a gate connected to a switchable voltage divider, said switchable voltage divider for rapidly switching said power amplifier MESFET on and off, by switching a first bias voltage to said gate for on, and by switching a second bias voltage to said gate for off.

* * * * *

UNITED STATES PATENT AND TRADEMARK OFFICE
CERTIFICATE OF CORRECTION

PATENT NO.    : 6,205,171 B1
DATED         : March 20, 2001
INVENTOR(S)   : Wen-Wei Yang et al.

It is certified that error appears in the above-identified patent and that said Letters Patent is hereby corrected as shown below:

<u>Title page,</u>
Item 54, the title should read: -- PC Mount Wireless RF Module --.

Signed and Sealed this

Fourth Day of September, 2001

*Attest:*

*Attesting Officer*

NICHOLAS P. GODICI
*Acting Director of the United States Patent and Trademark Office*